US008035135B2

(12) United States Patent
Hirabayashi

(10) Patent No.: US 8,035,135 B2
(45) Date of Patent: Oct. 11, 2011

(54) SEMICONDUCTOR MEMORY DEVICE

(75) Inventor: Seiji Hirabayashi, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 169 days.

(21) Appl. No.: 12/496,996

(22) Filed: Jul. 2, 2009

(65) Prior Publication Data

US 2010/0006905 A1   Jan. 14, 2010

(30) Foreign Application Priority Data

Jul. 10, 2008   (JP) ................... 2008-180273

(51) Int. Cl.
*H01L 23/52*   (2006.01)

(52) U.S. Cl. ................ 257/207; 257/E23.179

(58) Field of Classification Search ............ 257/E23.179
See application file for complete search history.

(56) References Cited

U.S. PATENT DOCUMENTS

| 5,119,169 | A | * | 6/1992 | Kozono et al. | ............... 257/369 |
| 6,278,148 | B1 | * | 8/2001 | Watanabe et al. | ............ 257/296 |
| 6,306,745 | B1 | * | 10/2001 | Chen | ............................. 438/599 |
| 7,514,795 | B2 | * | 4/2009 | Nishimura | .................... 257/776 |
| 7,557,398 | B2 | * | 7/2009 | Ota | ............... 257/300 |
| 7,786,566 | B2 | * | 8/2010 | Tomotani | ..................... 257/691 |
| 7,811,880 | B2 | * | 10/2010 | Shuy | ............................ 438/237 |
| 2006/0226462 | A1 | * | 10/2006 | Ota | .............................. 257/298 |

FOREIGN PATENT DOCUMENTS

JP   03-165556 A   7/1991
JP   2003-68986 A   3/2003

* cited by examiner

*Primary Examiner* — Benjamin Sandvik
(74) *Attorney, Agent, or Firm* — Sughrue Mion, PLLC

(57) ABSTRACT

To facilitate counting of memory cells in failure analysis, without limiting the arrangement of memory cells or increasing the number of processes. A memory cell array region 3 in which memory cells 3a are formed in a repetitive pattern is formed on a semiconductor substrate 2. Power supply wirings 4a and ground wirings 4b in a predetermined layer formed on the memory cell array region 3 are vertically and horizontally arranged in the form of a gird to correspond to the arrangement of the memory cells 3a at least in the memory cell array region 3.

6 Claims, 4 Drawing Sheets

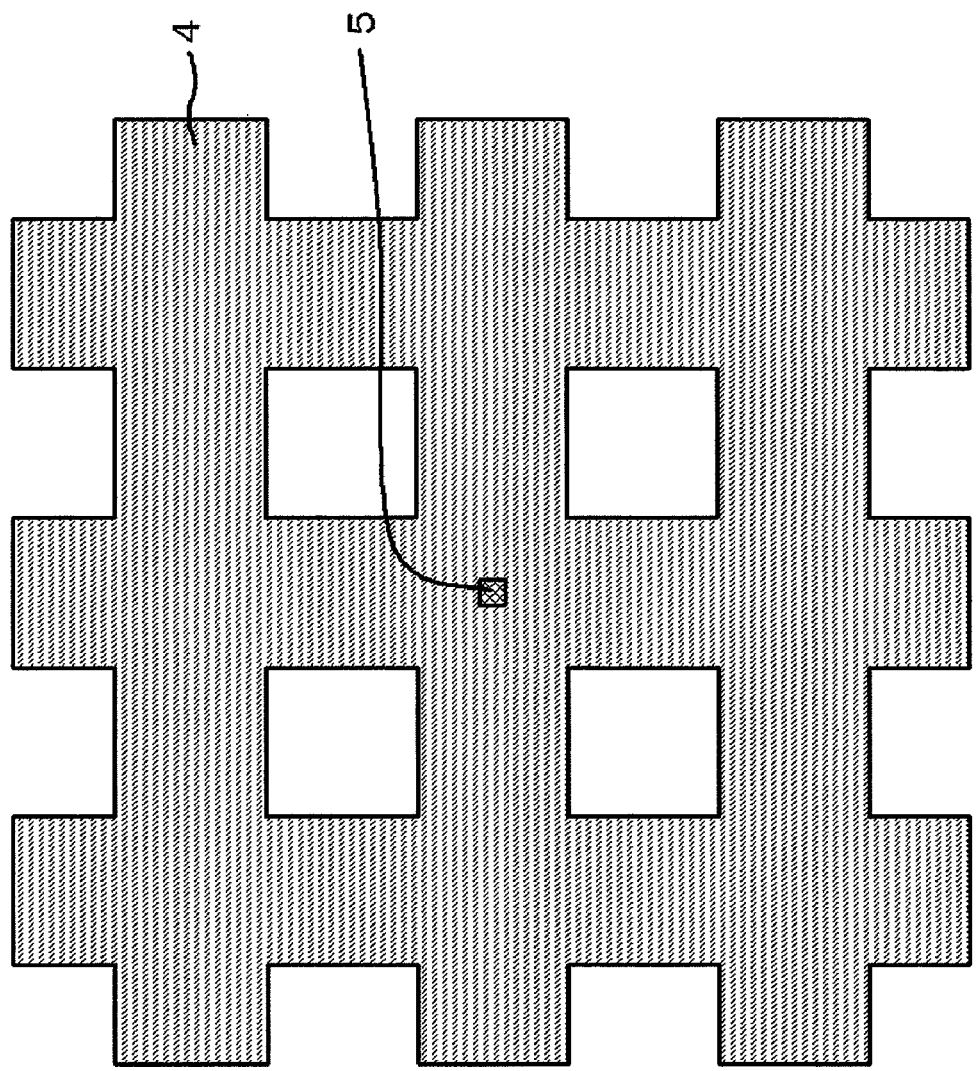
FIG.4 (EXEMPLARY EMBODIMENT 2)

SEMICONDUCTOR MEMORY DEVICE

FIELD OF THE INVENTION

Reference to Related Application

This application is based upon and claims the benefit of the priority of Japanese patent application No. 2008-180273 filed on Jul. 10, 2008, the disclosure of which is incorporated herein in its entirety by reference thereto.

The present invention relates to a semiconductor memory device comprising a semiconductor substrate on which memory cells are formed in a repetitive pattern, and in particular, to a semiconductor memory device suitable for analyzing defective cells.

BACKGROUND

In the area of semiconductor memory devices such as semiconductor memory products and semiconductor-memory-equipped logic products, when analyzing a defective cell, it is necessary to identify the location of the defective cell on an actual chip based on the defective bit address detected by a tester and to process a sample with an FIB (Focused Ion Beam) analysis method for observation with an SEM (Scanning Electron Microscope), a TEM (Transmission Electron Microscope), or the like.

Conventionally, in order to identify the location of a target defective cell, the chip needs to be polished until a layer in which 1-bit memory cells are recognizable, and marks need to be provided every few cells using the FIB analysis method to count memory cells without missing a single cell. Thus, a large number of processing seps are needed to process the sample, and it takes time to identify the location of the defective cell, possibly resulting in misidentification of the location of the defective cell.

Patent Document 1 discloses a semiconductor memory device comprising a chip on which memory cells are arranged in the form of a matrix. This document discloses that array marks made of two material layers as markers are used to indicate the arraying sequence of the memory cells, and it also discloses that a target memory cell can be identified by counting the array marks (conventional example 1).

Also, Patent Document 2 discloses a semiconductor memory device comprising a substrate on which memory cells are arranged in a repetitive pattern, a protective film formed above wiring layers relating to the memory cells, and optically recognizable film patterns located in the protective film, each pattern being located at a place corresponding to each of the memory cells. This document discloses that, by using the above film patterns and providing predetermined areas of the protective film with marks, the location of a target memory cell at least corresponding to a predetermined address used as information is recognized (conventional example 2).

Patent Document 1: Japanese Patent Kokai Publication JP-H3 (1991)-165556-A (FIG. 1)

Patent Document 2: Japanese Patent Kokai Publication JP-2003-68986-A (FIG. 1)

SUMMARY

The entire disclosures of the above-mentioned Patent Documents 1 to 2 are incorporated herein by reference thereto.

However, according to conventional example 1 (Patent Document 1), in case of memory products for which a larger capacity is increasingly required, if a defective portion is located around the central part of the cell region, it is often needed to count memory cells without effective utilization of the array marks provided in the X and Y directions of the memory cells, resulting in possible reduction of the effects of the array marks.

According to conventional example 2 (Patent Document 2), a photoresist exposure process needs to be added to provide the protective film with marks, which may increase manufacturing costs and time.

It is a primary object of the present invention to facilitate counting of memory cells in failure analysis, without restricting the arrangement (layout) of memory cells and without increasing the number of processes.

In a first aspect of the present invention, there is provided a semiconductor memory device which comprises a memory cell array region in which memory cells are formed in a repetitive pattern on a semiconductor substrate of the semiconductor memory device. Wirings in a predetermined layer formed on the memory cell array region are vertically and horizontally arranged in a form of a grid to correspond to the arrangement of the memory cells at least in the memory cell array region.

According to the present invention, the following meritorious effects are obtained. Since the wirings are regularly arranged in the form of a grid to correspond to the arrangement of the memory cells, in the failure analysis of the memory cells, it is possible to facilitate counting of memory cells when identifying the location of a target defective cell, without affecting the arrangement (layout) of the memory cells and without increasing the number of processes.

BRIEF DESCRIPTION OF THE DRAWINGS

FIG. 4 schematically shows an enlarged plan view of a part of the structure of the uppermost layer wirings on the memory cell array region of the semiconductor memory device according to exemplary embodiment 2 of the present invention.

PREFERRED MODES

In the following preferred modes are explained for better illustration of the invention.

In a preferred mode, there is provided a semiconductor memory device as aforementioned as the first aspect. (Mode 1)

Each wiring in a horizontal direction of the wirings may have a wiring width equal to a length of M cells, each wiring in a vertical direction of the wirings may have a wiring width equal to a length of N cells, a distance between two of the wirings adjacent to each other in a horizontal direction may be equal to a length of M cells, and a distance between two of the wirings adjacent to each other in a vertical direction is equal to a length of N cells, provided that M and N are natural numbers, respectively. (Mode 2)

The wirings may be made of a material that can be observed with a focused ion beam analyzer, an optical microscope, or an electron microscope. (Mode 3)

The wirings may be provided with marks, each mark formed every K cells in a horizontal direction and/or every L cells in a vertical direction, provided that K and L are natural numbers, respectively. (Mode 4)

Each of the marks may be formed at a place where two of the wirings cross vertically and horizontally. (Mode 5)

The wirings may comprise power supply wirings and/or ground wirings. (Mode 6)

The wirings may be uppermost layer wirings formed in a uppermost layer among the wirings formed on the memory cell array region. (Mode 7)

Figure 1:
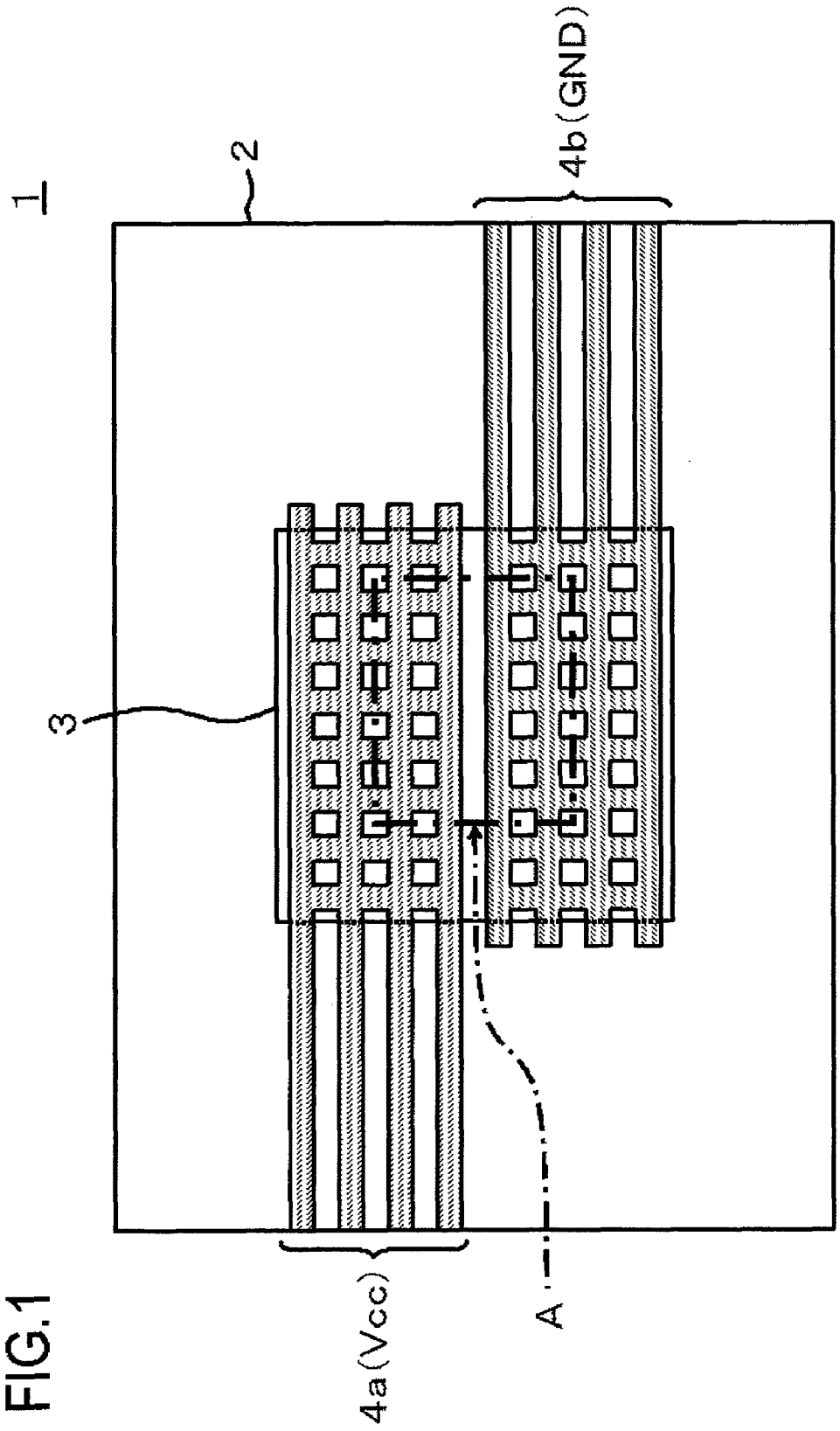
FIG. 1 schematically shows a plan view of the structure of a semiconductor memory device according to exemplary embodiment 1 of the present invention.

A semiconductor memory device according to an exemplary embodiment of the present invention comprises: a memory cell array region (reference character 3 in FIG. 1) in which memory cells (reference character 3a in FIG. 2) are formed in a repetitive pattern on a semiconductor substrate (reference character 2 in FIG. 1) of the semiconductor memory device, wherein wirings (corresponding to reference characters 4a and 4b in FIG. 1) formed on the memory cell array region (reference character 3 in FIG. 1) are vertically (in a first direction) and horizontally (in a second direction) arranged in the form of a grid to correspond to the arrangement of the memory cells (reference character 3a in FIG. 2) at least in the memory cell array region (reference character 3 in FIG. 1).

Exemplary Embodiment 1

Figure 2:
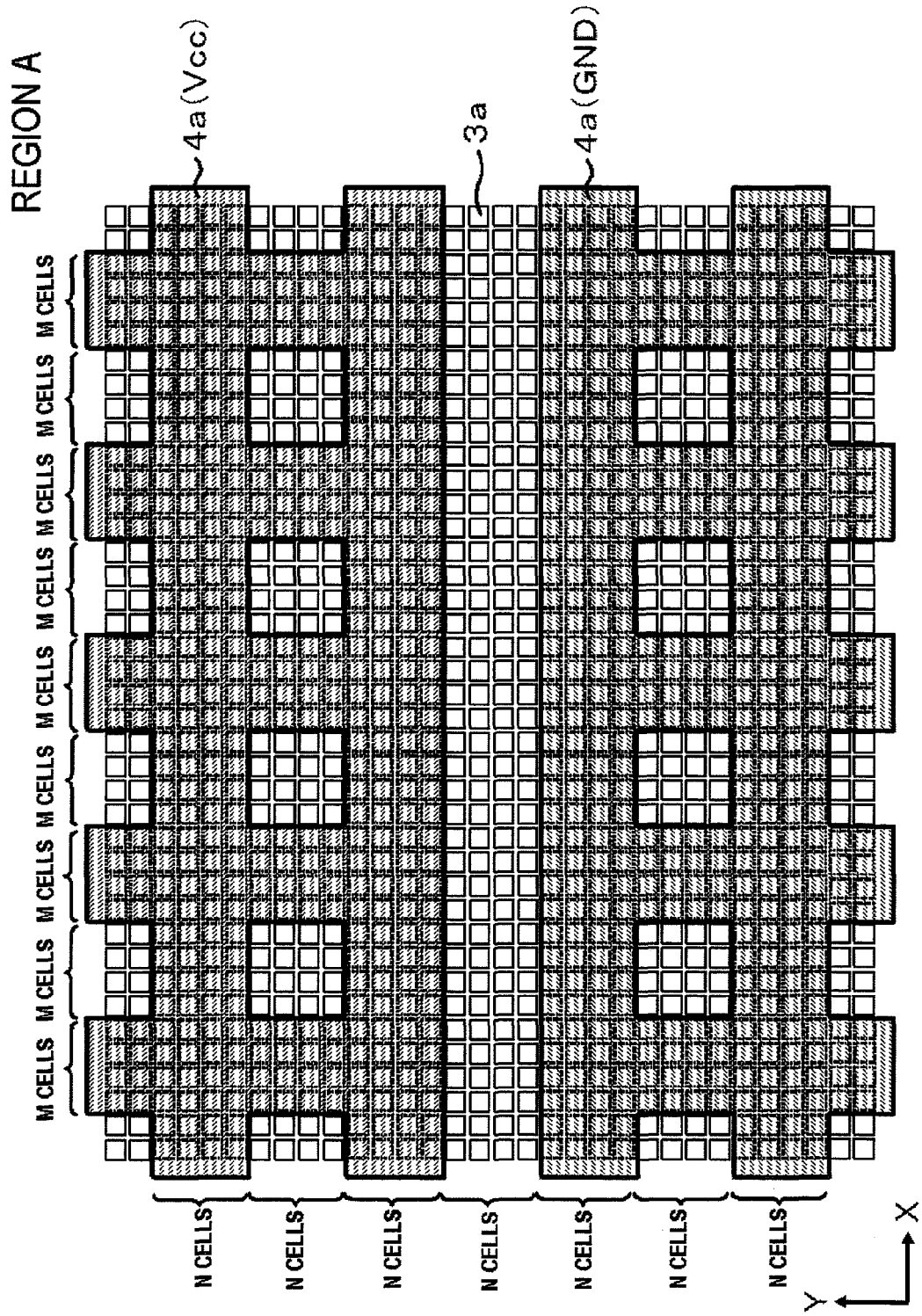
FIG. 2 shows an enlarged plan view of region A shown in FIG. 1 that schematically shows the structure of the semiconductor memory device according to exemplary embodiment 1 of the present invention.

A semiconductor memory device according to exemplary embodiment 1 of the present invention will be hereinafter described with reference to the drawings. FIG. 1 schematically shows a plan view of the structure of a semiconductor memory device according to exemplary embodiment 1 of the present invention. FIG. 2 shows an enlarged plan view of region A shown in FIG. 1 that schematically shows the structure of the semiconductor memory device according to exemplary embodiment 1 of the present invention.

Referring to FIG. 1, a semiconductor memory device 1 is a semiconductor chip comprising a memory cell array region 3 in which memory cells (reference character 3a in FIG. 2) are formed (arranged) in a repetitive pattern in the form of a grid on a semiconductor substrate 2. In the memory cell array region 3, as shown in FIG. 2, a plurality of memory cells 3a are arranged (laid-out) in the form of a grid. Around the memory cell array region 3 on the semiconductor substrate 2, memory peripheral circuits (not shown) for controlling the memory cells (reference character 3a in FIG. 2) are formed. On the semiconductor substrate 2 comprising the memory cell array region 3, interlayer dielectric films (not shown) and wiring layers (not shown) are alternately layered to form a laminate structure. In a wiring layer (uppermost layer wirings) located in a uppermost layer among wiring layers, at least in the memory cell array region 3, power supply wirings 4a and ground wirings 4b are formed.

The power supply wirings 4a are formed in the form of a grid. Each of the power supply wirings 4a has a wiring width equal to a length of M cells (4 cells in FIG. 2) in an X direction (in a horizontal direction in FIG. 2) and a length of N cells (4 cells in FIG. 2) in a Y direction (in a vertical direction in FIG. 2). Further, the distance between two of the power supply wirings 4a adjacent to each other in the X direction is equal to a length of M cells (4 cells in FIG. 2) and the distance between two of the power supply wirings 4a adjacent to each other in the Y direction is equal to a length of N cells (4 cells in FIG. 2). Thus, each of the power supply wirings 4a is formed every 2M cells in the X direction and every 2N cells in the Y direction. N and M are natural numbers of at least 1, and appropriate numbers can be selected for N, M depending on the overall arrangement of the memory cells 3a. Material used for the power supply wirings 4a is not limited, as long as the material can be recognized by an FIB analyzer, an optical microscope, or an electron microscope. Examples of the material may include a metal, e.g., Cu and Al.

The ground wirings 4b are formed in the same layer as the power supply wirings 4a in a region where the ground wirings 4b do not come into contact with the power supply wirings 4a. The distance between the ground wirings 4b and adjacent power supply wirings 4a in the Y direction (or in the X direction) is equal to a length of N cells (4 cells in FIG. 2). Other configurations of the ground wirings 4b are the same as those of the power supply wirings 4a.

According to exemplary embodiment 1, when identifying the location of a target defective cell during failure analysis of the memory cells 3a, counting of the memory cells can be facilitated without adversely affecting the arrangement (layout) of the memory cells 3a and without increasing the number of processes.

Further, since the power supply wirings 4a and the ground wirings 4b can be formed without additional process, no increase in product manufacturing period/cost is caused, and miniaturization is not adversely affected.

Furthermore, since the power supply wirings 4a and ground wirings 4b both disposed, e.g., in an upper layer that exist on the memory cell array region 3 are regularly arrayed in the form of a grid to correspond to the arrangement of the memory cells 3a, it is possible to use the power wirings 4a or the ground wirings 4b as markers mainly e.g.,) on the display screen of an FIB analyzer, so as to count the memory cells 3a. Thus, since there is no need to count the memory cells 3a one by one to identify the location of a target memory cell 3a, the length of time required for analysis can be shortened.

Also, even when a target defective cell is located in the central part of the memory cell array region 3, since the power supply wirings 4a and the ground wirings 4b are laid-out in the form of a grid pattern to be recognized in the X direction and in the Y direction on the memory cell array region 3, no trouble (difficulty) is caused in counting the memory cells.

Additionally, since the power supply wirings 4a and the ground wirings 4b are laid-out in the form of a grid, each wiring resistance can be made within a predetermined value.

Additionally, since the power supply wirings 4a and the ground wirings 4b can be formed by an existing wiring formation process, there is no need to add processes for exposure, deposition, etching, and the like. Therefore, manufacturing period and costs are not increased.

Exemplary Embodiment 2

Figure 3:
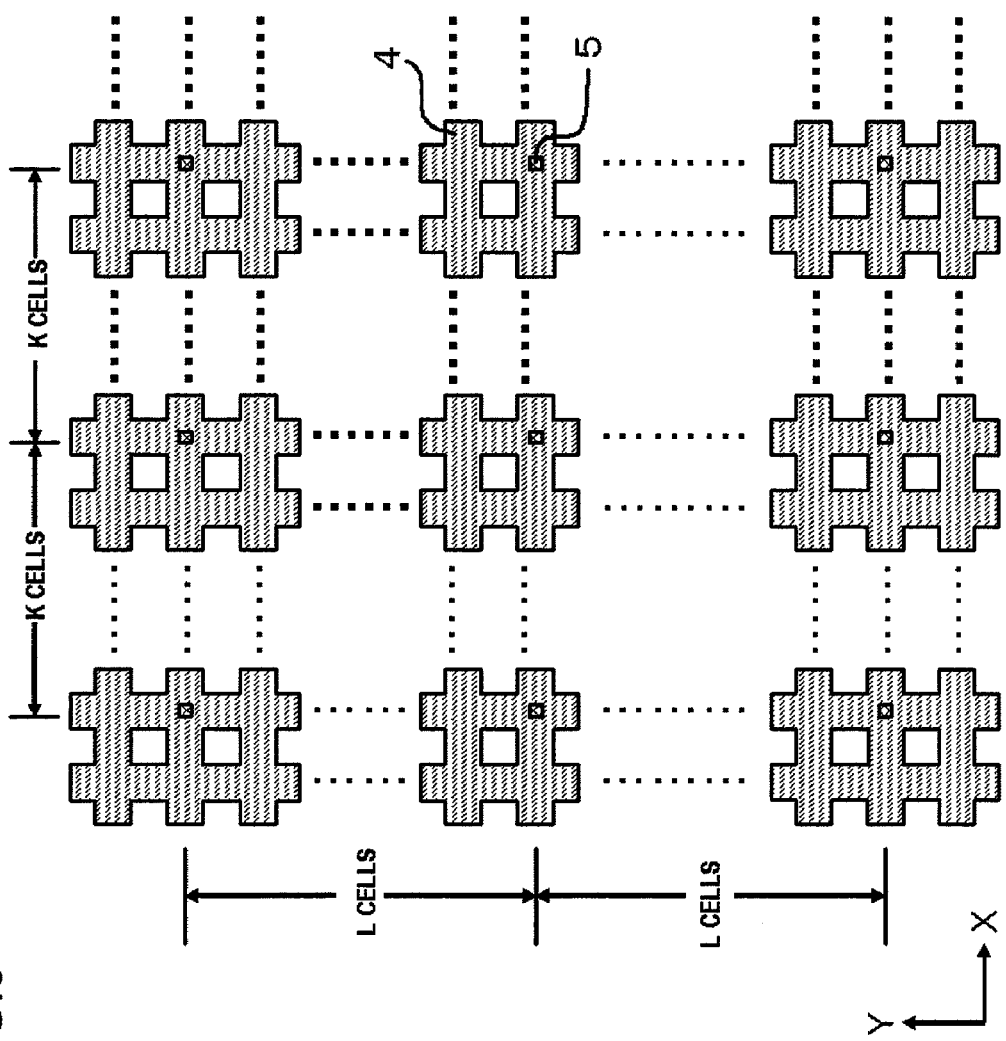
FIG. 3 schematically shows a plan view of the structure of uppermost layer wirings on a memory cell array region of a semiconductor memory device according to exemplary embodiment 2 of the present invention.

A semiconductor memory device according to exemplary embodiment 2 of the present invention will be hereinafter described with reference to the drawings. FIG. 3 schematically shows a top plan view of the structure of uppermost layer wirings on a memory cell array region of a semiconductor memory device according to exemplary embodiment 2 of the present invention. FIG. 4 schematically shows an enlarged plan view of a part of the structure of the uppermost layer wirings on the memory cell array region on the semiconductor memory device according to exemplary embodiment 2 of the present invention.

Based on the semiconductor memory device according to exemplary embodiment 2, when identifying a memory cell (corresponding to reference character 3a in FIG. 2) located in the central part of a large-scale memory cell array region (corresponding to reference character 3 in FIG. 1), in order to further facilitate counting of grid-shaped uppermost layer wirings 4 (corresponding to reference characters 4a and 4b in FIG. 2), the uppermost layer wirings 4 are provided with marks 5, each mark formed every K cells in the X direction and every L cells in the Y direction. The mark 5 is formed at a place where two of the uppermost layer wirings 4 cross vertically and horizontally. K and L are natural numbers (1, 2, 3, 4 . . . ), and it is possible to select any number suitable for recognizing the number of cells, such as 16 bit cells, 32 bit cells, 64 bit cells, and 128 bit cells, depending on the structure of the memory cell array. The uppermost layer wirings 4 exist on the memory cell array region (reference character 3 in FIG. 1) and are regularly arranged to correspond to the arrangement of the memory cells (reference character 3a in FIG. 2) and to be recognized in the X and Y directions with respect to the memory cell array, as in the structure of the power supply wirings (reference character 4a in FIG. 2) and the ground wirings (reference character 4b in FIG. 2) of exemplary embodiment 1.

According to exemplary embodiment 2, since the grid-shaped uppermost layer wirings 4 on the memory cell array region (corresponding to reference character 3 in FIG. 1) are provided with the marks 5 as markers at certain (predetermined) intervals, even in the case of a large-capacity memory cell array, it is possible to count the grid-shaped uppermost layer wirings 4 in the X and Y directions with greater ease, and thus, the memory cells can be easily counted.

While the power supply wirings 4a (Vcc), the ground wirings 4b (GND), and the uppermost layer wirings 4 have been described as uppermost layers in exemplary embodiments 1 and 2, the wirings do not need to be in uppermost layers as long as they can be observed with an FIB analyzer, an optical microscope, or an electron microscope.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor memory device, comprising:
a memory cell array region in which memory cells are formed in a repetitive pattern on a semiconductor substrate of the semiconductor memory device, wherein
wirings in a predetermined layer formed on said memory cell array region are vertically and horizontally arranged in a form of a grid to correspond to the arrangement of said memory cells at least in said memory cell array region;
wherein each wiring in a horizontal direction of said wirings has a wiring width equal to a length of M cells, each wiring in a vertical direction of said wirings has a wiring width equal to a length of N cells, a distance in a horizontal direction between two of said wirings adjacent to each other is equal to a length of M cells, and a distance in a vertical direction between two of said wirings adjacent to each other is equal to a length of N cells, provided that M and N are natural numbers, respectively.

2. The semiconductor memory device according to claim 1, wherein said wirings are made of a material that can be observed with a focused ion beam analyzer, an optical microscope, or an electron microscope.

3. The semiconductor memory device according to claim 1, wherein said wirings are provided with marks, each mark formed every K cells in a horizontal direction and/or every L cells in a vertical direction, provided that K and L are natural numbers, respectively.

4. The semiconductor memory device according to claim 3, wherein each of said marks is formed at a place where two of said wirings cross vertically and horizontally.

5. The semiconductor memory device according to claim 1, wherein said wirings comprise power supply wirings and/or ground wirings.

6. The semiconductor memory device according to claim 1, wherein said wirings are uppermost layer wirings formed in a uppermost layer among the wirings formed on said memory cell array region.

* * * * *